United States Patent
Xie

(10) Patent No.: US 10,269,542 B2
(45) Date of Patent: Apr. 23, 2019

(54) IONIZATION CHAMBER, ION-IMPLANTATION APPARATUS AND ION-IMPLANTATION METHOD

(71) Applicant: Wuhan China Star Optoelectronics Semicondutor Display Technology Co., Ltd., Wuhan, Hubei (CN)

(72) Inventor: Rui Xie, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 24 days.

(21) Appl. No.: 15/562,340

(22) PCT Filed: Jul. 26, 2017

(86) PCT No.: PCT/CN2017/094413
§ 371 (c)(1),
(2) Date: Sep. 27, 2017

(87) PCT Pub. No.: WO2019/000532
PCT Pub. Date: Jan. 3, 2019

(65) Prior Publication Data
US 2018/0374681 A1 Dec. 27, 2018

(30) Foreign Application Priority Data
Jun. 26, 2017 (CN) .......................... 2017 1 0495674

(51) Int. Cl.
*H01J 37/32* (2006.01)
*C23C 14/48* (2006.01)

(52) U.S. Cl.
CPC ........ *H01J 37/32449* (2013.01); *C23C 14/48* (2013.01); *H01J 37/32412* (2013.01)

(58) Field of Classification Search
USPC .......................... 250/423 R, 424, 427, 423 F
See application file for complete search history.

(56) References Cited

U.S. PATENT DOCUMENTS

2008/0296510 A1* 12/2008 Kasama ................. B82Y 10/00
250/423 R
2016/0133427 A1* 5/2016 Sinha

FOREIGN PATENT DOCUMENTS

| CN | 103094034 A | * | 5/2013 |
| CN | 103730393 A | * | 4/2014 |
| CN | 204558414 U | * | 8/2015 |

* cited by examiner

*Primary Examiner* — Kiet T Nguyen
(74) *Attorney, Agent, or Firm* — Andrew C. Cheng

(57) ABSTRACT

An ionization chamber includes a cavity in which an air supply pipe and a filament are located. The air supply pipe is bent to form a closed frame in which the filament is accommodated. The filament is energized to generate hot electrons. The air supply pipe has an air outlet on one side facing the filament for outputting an ion-source gas. The ion-source gas collides with the hot electrons to produce plasma. Also disclosed are an ion-implantation apparatus and an ion-implantation method. Because the ion-source gas collides with the hot electrons uniformly, the plasma concentration at each position in the cavity is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

17 Claims, 3 Drawing Sheets

IONIZATION CHAMBER, ION-IMPLANTATION APPARATUS AND ION-IMPLANTATION METHOD

CROSS-REFERENCE TO RELATED APPLICATIONS

The present application claims the priority benefit of application serial No. 201710495674.7, entitled "Ionization chamber, ion-implantation apparatus and ion-implantation method", filed on Jun. 26, 2017, which is incorporated herein by reference for all purposes and fully set forth herein.

BACKGROUND OF THE APPLICATION

Field of Application

The present application relates to the field of liquid crystal display, and more particularly to an ionization chamber, ion-implantation apparatus and ion-implantation method.

Description of Prior Art

Display devices have become an indispensable part of modern life. In the process of low temperature polysilicon (LTPS) thin film transistors and organic light-emitting diodes (OLEDs) for display devices, the ion-implantation apparatus is needed to implant the plasma into the glass substrate. In the ion-implantation apparatus, the ion-source gas evenly enters in the ionization chamber through the air supply pipe, the filament of the ionization chamber filament generates hot electrons after supplying with current, the hot electrons and ion-source gas collide to each other to generate plasma.

In the conventional art, the air supply pipe of the ion-implantation apparatus is a single hole which is connected to the ionization chamber, and the contact between the ion-source gas flowing out of the single hole and the filament are not uniform. In order to ensure the uniformity of the generated plasma, the current flowing through the filament needs to be adjusted, but this led to uneven current through the filament, the current is too large to make the filament premature rupture, shorten the filament's life, resulting in equipment maintenance cycle shortened and the display equipment production costs improved. It could not guarantee filament's life while improving the plasma uniformity and the ion-implantation effect.

SUMMARY OF THE APPLICATION

The present application provides an Ionization chamber, ion-implantation apparatus and ion-implantation method, which is capable of solving the issues of the conventional art, such as short filament's life, short equipment maintenance cycle, high display equipment production costs, and no guarantee about the filament's life while improving the plasma uniformity and the ion-implantation effect.

In order to solve the technical issues, the present application provides an ionization chamber, applying for an ion-implantation apparatus. The ionization chamber comprises a cavity, an air supply pipe and at least one filament. The air supply pipe and the filament are located within the cavity. The air supply pipe is bent to form a closed frame. The filament is accommodated in the frame. The filament is energized to generate hot electrons. The air supply pipe is disposed of at least one air outlet on one side facing the filament. The air outlet is used for outputting an ion-source gas. The ion-source gas collides with the hot electrons to produce plasma.

Wherein the number of the air outlet is plural. The sizes of the air outlets are the same and the distribution density of the air outlets are negatively correlated with the distance between the air outlets and the filament.

Wherein the air outlets are one-way air holes. When the ion-source gas is inputted to the air supply pipe, the air outlets are opened and the ion-source gas flows outside the air supply pipe through the air outlets. When the gas is stopped to be inputted to the air supply pipe, the air outlets are closed. Inside of the air supply pipe is isolated from the outside of the air supply pipe.

Wherein the filament and the air supply pipe surrounding around the filament forms a plasma generating group and the number of the plasma generating group is plural.

Wherein the number of the filament in the plasma generating group is plural. The air supply pipe surrounds the plurality of filaments simultaneously.

Wherein the air supply pipe further comprises branch pipes communicating with the air supply pipe. The branch pipes are located between adjacent filaments in the plasma generation group. The branch pipes are disposed of the air outlets on one side facing the filament.

Wherein the number of the filament in the plasma generation group is one. The air supply pipe symmetrically surrounds the filament.

Wherein the ion-source gas is a boron trifluoride gas or a phosphine gas.

The present application further provides an ion-implantation apparatus, which comprises an ionization chamber. The ionization chamber comprises a cavity, an air supply pipe and at least one filament. The air supply pipe and the filament are located within the cavity. The air supply pipe is bent to form a closed frame. The filament is accommodated in the frame. The filament is energized to generate hot electrons. The air supply pipe is disposed of at least one air outlet on one side facing the filament. The air outlet is used for outputting an ion-source gas. The ion-source gas collides with the hot electrons to produce plasma.

Wherein the number of the air outlet is plural. The sizes of the air outlets are the same and the distribution density of the air outlets are negatively correlated with the distance between the air outlets and the filament.

Wherein the air outlets are one-way air holes. When the ion-source gas is inputted to the air supply pipe, the air outlets are opened and the ion-source gas flows outside the air supply pipe through the air outlets. When the gas is stopped to be inputted to the air supply pipe, the air outlets are closed. Inside of the air supply pipe is isolated from the outside of the air supply pipe.

Wherein the filament and the air supply pipe surrounding around the filament forms a plasma generating group and the number of the plasma generating group is plural.

Wherein the number of the filament in the plasma generating group is plural. The air supply pipe surrounds the plurality of filaments simultaneously.

Wherein the air supply pipe further comprises branch pipes communicating with the air supply pipe. The branch pipes are located between adjacent filaments in the plasma generation group. The branch pipes are disposed of the air outlets on one side facing the filament.

Wherein the number of the filament in the plasma generation group is one. The air supply pipe symmetrically surrounds the filament.

Wherein the ion-source gas is a boron trifluoride gas or a phosphine gas.

The present application further provides an ion-implantation method, which comprises:

An ion-implantation apparatus is provided. The ion-implantation apparatus comprises an ionization chamber. The ionization chamber comprises a cavity, an air supply pipe and at least one filament. The air supply pipe and the filament are located within the cavity. The air supply pipe surrounds the filament and the air supply pipe is disposed of at least one air outlet on one side facing the filament.

Current is applied to the filament to make the filament generate hot electrons.

An ion-source gas is inputted to the air supply pipe. The ion-source gas is outputted through the air outlet and collides with the hot electrons to generate plasma for implanting to a substrate.

The beneficial effects of the present application are: The air supply pipe surrounds the filaments. The air supply pipe outputs the ion-source gas to the filaments through the air outlets on one side facing the filament. Because the ion-source gas collides with the hot electrons uniformly, the plasma concentration at each position in the cavity is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

BRIEF DESCRIPTION OF THE DRAWINGS

In order to more clearly illustrate the embodiments of the present application or the technical solutions in the conventional art, the following drawings, which are to be used in the description of the embodiments or the conventional art, will be briefly described. It will be apparent that the drawings in the following description are some embodiments of the present application, and other drawings may be obtained by those skilled in the art without departing from the inventive work.

DETAILED DESCRIPTION OF THE PREFERRED EMBODIMENTS

The technical solutions in the embodiments of the present application will be described in detail below in connection with the drawings in the embodiments of the present application. Obviously, the described embodiments are part of the embodiments of the present application, and not all embodiments. All other embodiments obtained by those skilled in the art without departing from the inventive work of the present application are intended to be within the scope of the present application, based on the embodiments of the application.

The ionization chamber provided by the embodiment of the present application is applied to an ion-implantation apparatus, and the ion-implantation apparatus is a key device before the process of manufacturing an integrated circuit. The ion implantation is a technique for doping a region near a semiconductor surface; the purpose is to change the carrier concentration and conduction type of the semiconductor. Ion implantation Compared with conventional thermal doping process, the ion implantation can perform precise control of injection dosing, injection angle, injection depth, and lateral diffusion and so on, which can overcome the limitation of conventional process and improve the integration level, opening speed, yield rate, and life of the circuit, furthermore, reducing costs and power consumption. Ion implantation apparatus is widely used in doping process, which could meet the requirements of shallow junction, low temperature and precise control, has become an essential device among the integrated circuit manufacturing process. Furthermore, the ionization chamber and the ion-implantation apparatus provided in the present embodiment can be applied to the processes of the low-temperature polysilicon thin film transistor and the organic light emitting diode of the display device, i.e., implanting the plasma on the glass substrate surface.

Figure 1:
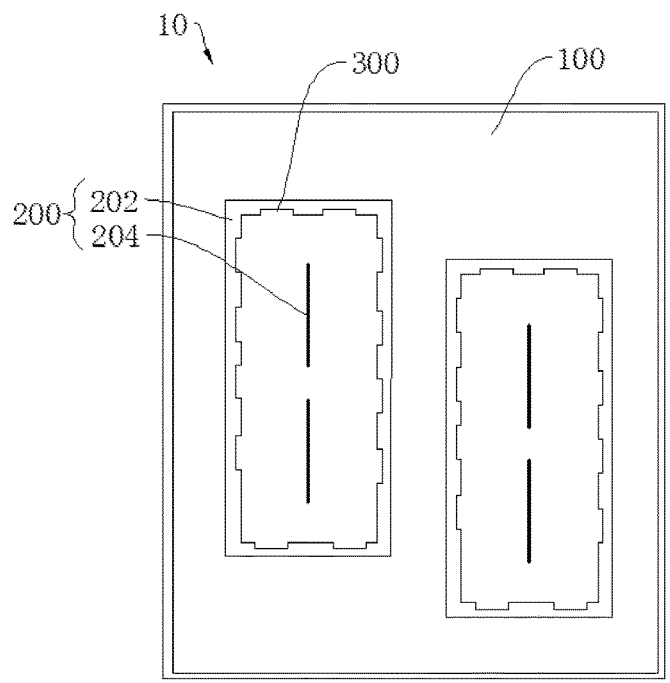
FIG. 1 is a structural illustrative view of an ionization chamber provided in the first embodiment of the present application.
Figure 2:
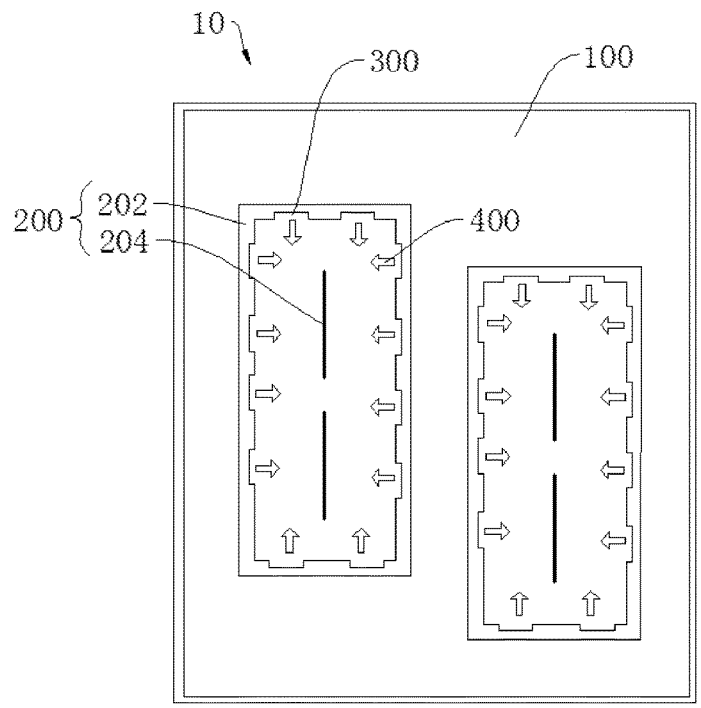
FIG. 2 is an operating illustrative view of an ionization chamber provided in the first embodiment of the present application.

Please refer to FIGS. 1 and 2, the ionization chamber 10 provided in the first embodiment of the present application comprises a cavity 100, air supply pipes 202 and filaments 204. The cavity is a closed space which is enclosed by a plurality of wall surfaces connected with each other, for providing an environment for generating the plasma generated by the collision between the ion-source gas and the hot electrons. The air supply pipes 202 are located in the chamber 100 and the air supply pipes 202 communicates with the gas supply means for supplying the ion-source gas, and the gas supply means outputs the ion-source gas into the chamber 100 through the air supply pipes 202. The filaments 204 are also located within the cavity 100, and in particular, the filaments 204 are wires. In a preferred embodiment, the filaments 204 are tungsten wires. Furthermore, the shape of the filaments 204 may be straight lines or may be bent lines such as fold lines, multi segment polylines, arcs, etc. The present application does not limit the shape of the filaments 204. The air supply pipes 202 are bent to form a closed frame. The filaments are accommodated in the frame, i.e. the air supply pipes 202 surrounds the filaments 204. In the preferred embodiment, the filaments 204 are located at the center of the frame so that the filaments 204 are the same distance from each side of the frame (i.e., the air supply pipes 202). In the present embodiment, the air supply pipes 202 may be of a closed frame or a non-closed shape having a notch, and is not limited thereto.

In the present embodiment, the air supply pipe 202 is disposed of air outlets 300 on one side facing the filament 204. The air outlets 300 are used for outputting an ion-source gas to collide the hot electrons for producing plasma. Specifically, the shape of the air outlets 300 may be circles or gaps, and the ion-source gas may be uniformly output to the filaments 204. The air outlets 300 are located on the wall surface of the air supply pipes 202 facing the filaments 204, and the ion-source gas of the air supply means inputted to the air supply pipe 202 is outputted from the air outlets 300, then, the ion-source gas is close to the filaments 204, the current-operated filaments 204 produces hot electrons that collide with the ion-source gas to produce a plasma. The plasma is used for the complete ion implantation process of the glass substrate that is subsequently implanted into the semiconductor device.

In one preferred embodiment, the air outlets 300 are one-way air holes. When the ion-source gas is inputted to the air supply pipe 202, the air outlets 300 are opened and the ion-source gas flows outside the air supply pipe 202 through the air outlets 300. When the gas is stopped to be inputted to the air supply pipe 202, the air outlets 300 are closed. Inside of the air supply pipe 202 is isolated from the outside of the air supply pipe 202. Specifically, the air outlets 300 are film-type structures, that is, the air outlet 300 includes an orifice and a film cover attached to the orifice. The film cover is partially connected to the outer wall of the air supply pipe 202, and the film cover can only be bent in direction other than the outer wall of the air supply pipe 202 (the air outlet is at opened state), so that the air supply pipe has two operating conditions: 1. closed state, the film cover covers the orifice, isolates the inside and outside of the air supply pipe 202, and blocks the air exchange between inside and outside of the air supply pipe 202; 2. opened state, the ion-source gas is supplied to the inside of the air supply pipe 202, and the air pressure inside the air supply pipe 202 is greater than the outside air pressure. The film cover is opened and the ion-source gas flows from the inside of the air supply pipe 202 to the outside. Uni-directional outlets prevent gas from flowing backwards, increase the purity of the ion-source gas, and protect the air outlets 300.

Specifically, in FIG. 2, the arrows 400 indicate the direction of the air flow of the ion-source gas output from the air outlets 300 of the air supply pipe 202. As shown in the fig., the ion-source gas flows from the air outlets 300 and flows toward the filaments 204 so that the ions-source gas directly and uniformly collides with the hot electrons of the filaments 204 to produces plasma with uniform concentration.

The air supply pipe 202 surrounds the filaments 204. The air supply pipe 202 outputs the ion-source gas to the filaments 204 through the air outlets 300 on one side facing the filament 204. Because the ion-source gas collides with the hot electrons uniformly, the plasma concentration at each position in the cavity 100 is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

In the embodiment, the number of the air outlet 300 is plural. The air outlets 300 are uniformly disposed on one side of the air supply pipe 202 facing the filaments. In a preferred embodiment, the sizes and the shape of each air outlet 300 is the same to output a uniform ion-source gas. Furthermore, the distribution density of the air outlets 300 is negatively correlated with the distance between the air outlets 300 and the filament 204. For the smaller the distance between the air outlets 300 and the filament 204, the higher the probability of the ion-source gas colliding with the hot electrons generated by the filament 204 after driving with current, the greater the concentration of the generated plasma; the greater the distance between the air outlets 300 and the filament 204, the smaller the probability of the ion-source gas colliding with the hot electrons generated by the filament 204 after driving with current, the smaller the concentration of the generated plasma. That is, the distribution density of the air outlets 300 and the distance between the air outlets 300 and the filaments 204 are two main factors which will affect the plasma concentration. With adjustment of the distribution density of the air outlets 300, the distribution density of the air outlets 300 closer to the filaments 204 is smaller and the distribution density of the air outlets 300 farer to the filaments 204 is greater, to make the plasma generated around the filaments 204 is uniform.

In the embodiment, the filament 204 and the air supply pipe 202 surrounding around the filament 204 forms a plasma generating group 200 and the number of the plasma generating group 200 is plural. Specifically, each of the plasma generating groups 200 is a separate plasma generating unit. The air supply tube 202 belonging to the different plasma generating group 200 may be individually controlled, to separately supply and control the output ion-source gas through the gas supply means to raise the controllability of the ion-implantation apparatus. The air supply tube 202 belonging to the different plasma generating group 200 may be controlled at the same time, to supply and control the output ion-source gas through the same gas supply means to simplify the operation and use of the ion-implantation apparatus. Furthermore, the filaments 204 belonging to the different plasma generating groups 200 may be connected in parallel and be controlled individually by electronic devices such as a switch. With individually controlling the current of the filaments of each plasma generating group 200 to control the filament 204 and generate the hot electrons to raise the controllability of the ion-implantation apparatus. The filaments 204 belonging to the different plasma generating groups 200 may be connected in series and be controlled to generate the hot electrons by controlling the current to simplify the operation and use of the ion implantation apparatus. In a preferred embodiment, the size, shape and resistance of the filaments 204 of the plasma generating groups 200 may be the same or different. The respective portions of the filaments 204 may have the same resistance and uniformity.

In the embodiment, the number of the filament 204 in the plasma generating group 200 is plural. The air supply pipe 202 surrounds the plurality of filaments 204 simultaneously. The air supply tubes 202 in each of the plasma generation groups 200 output the ion-source gas to the plurality of filaments 204, and the plurality of filaments 204 are operated simultaneously in one plasma generation group 200, the cost is reduced. Further, the plurality of filaments 204 in the same plasma generating group 200 may be individually controlled. Specifically, the amount of hot electrons generated by the filaments 204 is controlled by individually controlling the current flowing through filaments 204, to change the plasma concentration generated by the oscillation between the hot electrons and the ion-source gas. In a preferred embodiment, the size, shape and resistance of the filaments 204 of the plasma generating groups 200 may be the same or different. The respective portions of the filaments 204 may have the same resistance and uniformity.

The air supply pipe 202 surrounds the filaments 204. The air supply pipe 202 outputs the ion-source gas to the filaments 204 through the air outlets 300 on one side facing the filament 204. Because the ion-source gas collides with the hot electrons uniformly, the plasma concentration at each position in the cavity 100 is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

In the embodiment, the ion-source gas is a boron trifluoride gas or a phosphine gas. BF3, boron trifluoride, is a colorless gas, has a choking effect, and can produce dense white smoke in the humid air. Under the action of the magnetic field, the hot electrons generated by the filament 204 will collide with the BF3 gas to produce B+ ions. Phosphine (PH3) is a colorless, highly toxic, flammable, liquefied compressed gas stored in a cylinder. The PH3 gas is heavier than air and has a similar smell of smelly fish. Under the action of the magnetic field, the hot electrons generated by the filament 204 will collide with the PH3 gas to produce P+ ions.

Figure 3:
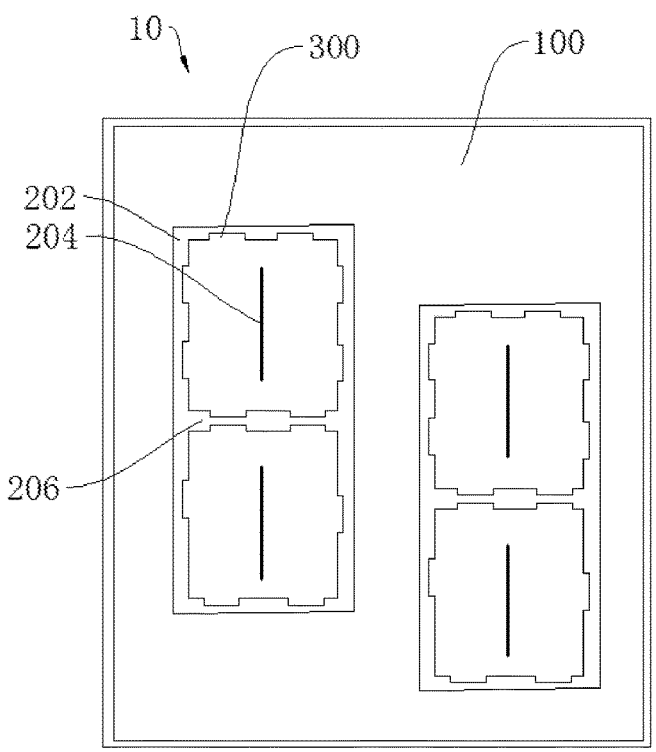
FIG. 3 is a structural illustrative view of an ionization chamber provided in the second embodiment of the present application.

Please refer to FIG. 3, the difference between the ionization chamber 10 provided in the second embodiment and the first embodiment of the present application is: the air supply pipe 202 further comprises branch pipes 206 communicating with the air supply pipe 202. The branch pipes 206 are located between adjacent filaments 204 in the plasma generation group 200. The branch pipes 206 are disposed of the air outlets 300 on one side facing the filament 204. In particular, the branch pipe 206 divides the air supply tube 202 surrounding the plurality of filaments 204 into a plurality of small cells, each of which includes at least one filament 204. In the present embodiment, the number of the filaments included the small cell formed by each branch pipe 206 and the air supply pipe 202 is the same, to improve the uniformity of the generated plasma. In a preferred embodiment, each of the small cells comprises a filament 204, i.e. each filament 204 individually produces plasma to maximize the concentration of the generated plasma.

The air supply pipe 202 surrounds the filaments 204. The air supply pipe 202 outputs the ion-source gas to the filaments 204 through the air outlets 300 on one side facing the filament 204. Because the ion-source gas collides with the hot electrons uniformly, the plasma concentration at each position in the cavity 100 is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

Figure 4:
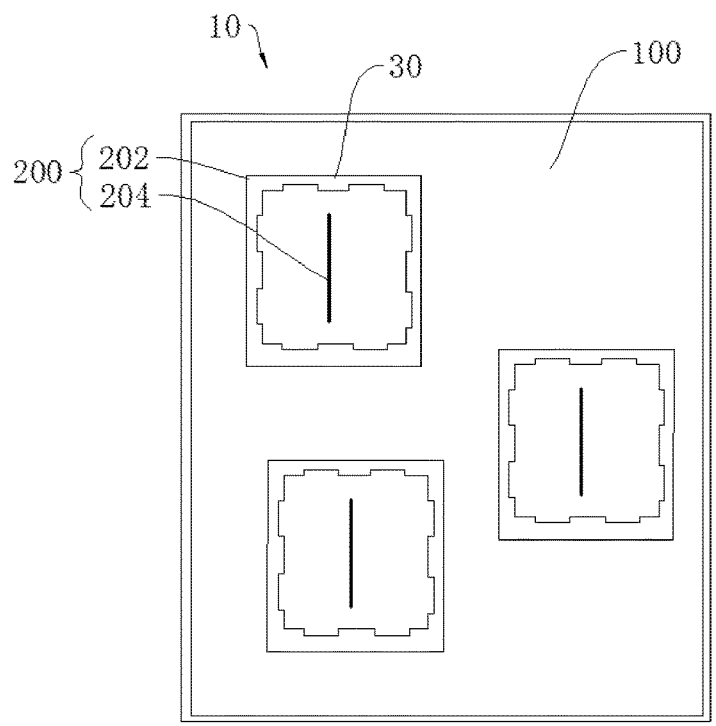
FIG. 4 is a structural illustrative view of an ionization chamber provided in the third embodiment of the present application.

Please refer to FIG. 4, the difference between the ionization chamber 10 provided in the third embodiment and the first embodiment of the present application is: the number of filaments 204 in the plasma generating group 200 is one, and the air supply pipe 202 surrounds the filament 204 symmetrically. Specifically, the distances between the filament 204 and sides of the closed pattern enclosed by the air supply tube 202 are the same, or the filament 204 is located at the center of the closed pattern enclosed by the air supply tube 202, so that the air supply tube 202 uniformly feeds the ion-source gas to each portion of the filament 204, and the plasma concentration generated by the oscillation between the ion-source gas and the filament 204 is uniform. Each filament 204 corresponds to an air supply tube 202, i.e. each filament 204 individually produces plasma to maximize the concentration of the generated plasma.

The air supply pipe 202 surrounds the filaments 204. The air supply pipe 202 outputs the ion-source gas to the filaments 204 through the air outlets 300 on one side facing the filament 204. Because the ion-source gas collides with the hot electrons uniformly, the plasma concentration at each position in the cavity 100 is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

Figure 5:
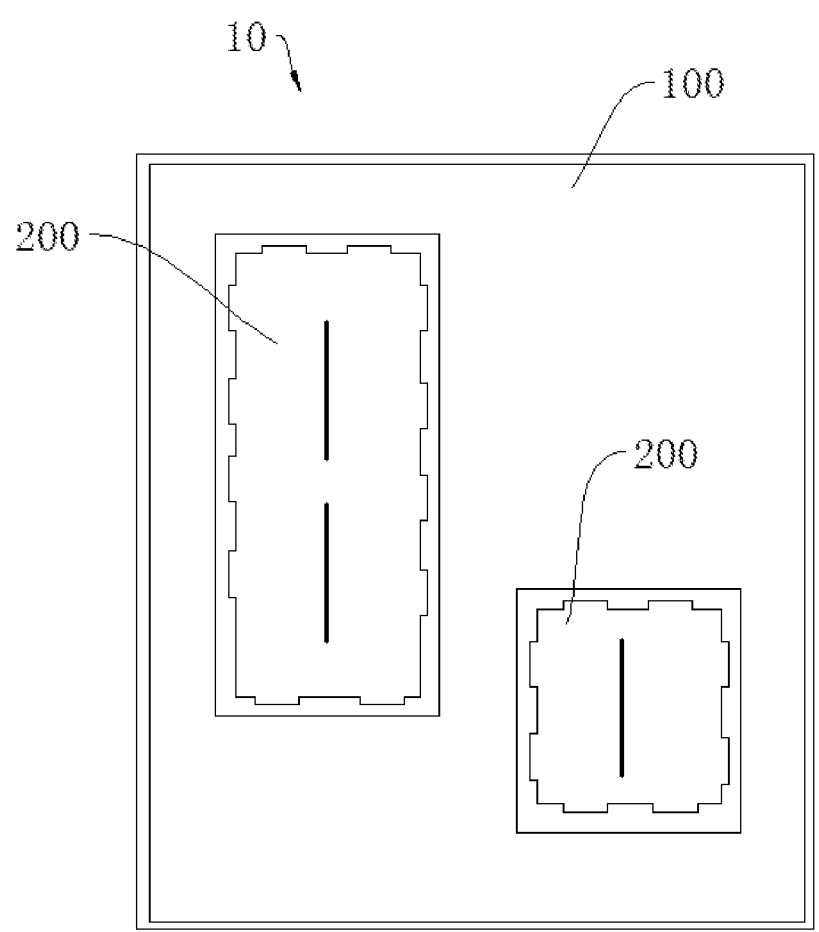
FIG. 5 is a structural illustrative view of an ionization chamber provided in the fourth embodiment of the present application.

Please refer to FIG. 5, the difference between the ionization chamber 10 provided in the fourth embodiment and the first embodiment of the present application is: the number of filaments 204 in each of the plasma generating groups 200 is different. Specifically, a part of the plasma generation groups 200 comprises a filament 204; still a part of the plasma generation groups 200 comprises a plurality of filaments 204. The number of filaments 204 in each of the plasma generating groups 200 increases the diversity of the ionization chamber 10 and the number of filaments 204 of the plasma generating group 200 can be designed in accordance with the actual ion implantation requirements to improve the practicability of the ion-implantation apparatus.

The air supply pipe 202 surrounds the filaments 204. The air supply pipe 202 outputs the ion-source gas to the filaments 204 through the air outlets 300 on one side facing the filament 204. Because the ion-source gas collides with the hot electrons uniformly, the plasma concentration at each position in the cavity 100 is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

The present application further provides an ion-implantation apparatus for implanting plasma into a semiconductor device. The ion-implantation apparatus comprises the ionization chamber 10 described above. The air supply pipe 202 surrounds the filaments 204. The air supply pipe 202 outputs the ion-source gas to the filaments 204 through the air outlets 300 on one side facing the filament 204. Because the ion-source gas collides with the hot electrons uniformly, the plasma concentration at each position in the cavity 100 is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

The present application further provides an ion-implantation method, which comprises:

An ion-implantation apparatus is provided. The ion-implantation apparatus comprises an ionization chamber 10. The ionization chamber 10 comprises a cavity 100, an air supply pipe 202 and at least one filament 204. The air supply pipe 202 and the filament 204 are located within the cavity 100. The air supply pipe 202 surrounds the filament 204 and the air supply pipe 202 is disposed of at least one air outlet 300 on one side facing the filament 204.

S101, current is applied to the filament 204 to make the filament 204 generate hot electrons.

In the embodiment, the size, shape and resistance of the filaments 204 may be the same or different. The respective portions of the filaments 204 may have the same resistance and uniformity. Furthermore, the amount of hot electrons generated by the filament 204 is controlled by adjusting the magnitude of the current flowing through the filament 204. In the embodiment, the magnitude of the current flowing through the filament 204 is controlled to be uniform and stable to obtain stable and uniform hot electrons.

S102, an ion-source gas is inputted to the air supply pipe 202. The ion-source gas is outputted through the air outlet 300 and collides with the hot electrons to generate plasma for implanting to a substrate.

Specifically, the shape of the air outlets 300 may be circles or gaps, and the ion-source gas may be uniformly output to the filaments 204. The air outlets 300 are located on the wall surface of the air supply pipes 202 facing the filaments 204, and the ion-source gas of the air supply means inputted to the air supply pipe 202 is outputted from the air outlets 300, then, the ion-source gas is close to the filaments 204, the current-operated filaments 204 produces hot electrons that collide with the ion-source gas to produce a plasma. The plasma is used for the complete ion implantation process of the glass substrate that is subsequently implanted into the semiconductor device.

In the embodiment, the ion-source gas is a boron trifluoride gas or a phosphine gas. BF3, boron trifluoride, is a colorless gas, has a choking effect, and can produce dense white smoke in the humid air. Under the action of the magnetic field, the hot electrons generated by the filament 204 will collide with the BF3 gas to produce B+ ions. Phosphine (PH3) is a colorless, highly toxic, flammable, liquefied compressed gas stored in a cylinder. The PH3 gas is heavier than air and has a similar smell of smelly fish. Under the action of the magnetic field, the hot electrons generated by the filament 204 will collide with the PH3 gas to produce P+ ions.

The air supply pipe 202 surrounds the filaments 204. The air supply pipe 202 outputs the ion-source gas to the filaments 204 through the air outlets 300 on one side facing the filament 204. Because the ion-source gas collides with the hot electrons uniformly, the plasma concentration at each position in the cavity 100 is uniform; the ion-implantation effect is improved. During the process of the uniformity of the plasma concentration, the regulation about frequency of current of the filament is reduced, then the filament's life is increased, the equipment maintenance cycle is extended, the display equipment production cost is reduced.

The foregoing is intended only as specific embodiments of the present application, but the scope of protection of the present application is not limited thereto and it will be readily apparent to those skilled in the art that various equivalents may be readily apparent to those skilled in the art, these modifications or substitutions, which should be within the scope of the present application. Accordingly, the scope of protection of the present application is subject to the scope of protection of the claims.

What is claimed is:

1. An ionization chamber, applying for an ion-implantation apparatus, wherein the ionization chamber comprises a cavity, an air supply pipe and at least one filament, the air supply pipe and the filament are located within the cavity, the air supply pipe is bent to form a closed frame, the filament is accommodated in the frame, the filament is energized to generate hot electrons, the air supply pipe is disposed of at least one air outlet on one side facing the filament, the air outlet is used for outputting an ion-source gas, the ion-source gas collides the hot electrons to produce a plasma.

2. The ionization chamber according to claim 1, wherein the number of the air outlet is plural, the sizes of the air outlets are the same, and the distribution density of the air outlets are negatively correlated with the distance between the air outlets and the filament.

3. The ionization chamber according to claim 2, wherein the air outlets are one-way air holes, when the ion-source gas is inputted to the air supply pipe, the air outlets are opened and the ion-source gas flows outside the air supply pipe through the air outlets, when the gas is stopped to be inputted to the air supply pipe, the air outlets are closed, and inside of the air supply pipe is isolated from the outside of the air supply pipe.

4. The ionization chamber according to claim 3, wherein the filament and the air supply pipe surrounding around the filament forms a plasma generating group and the number of the plasma generating group is plural.

5. The ionization chamber according to claim 4, wherein the number of the filament in the plasma generating group is plural, the air supply pipe surrounds the plurality of filaments simultaneously.

6. The ionization chamber according to claim 5, wherein the air supply pipe further comprises branch pipes communicating with the air supply pipe, the branch pipes are located between adjacent filaments in the plasma generation group, the branch pipes are disposed of the air outlets on one side facing the filament.

7. The ionization chamber according to claim 4, wherein the number of the filament in the plasma generation group is one and the air supply pipe symmetrically surrounds the filament.

8. The ionization chamber according to claim 1, wherein the ion-source gas is a boron trifluoride gas or a phosphine gas.

9. An ion-implantation apparatus, wherein the ion-implantation apparatus comprises an ionization chamber, the ionization chamber comprises a cavity, an air supply pipe and at least one filament, the air supply pipe and the filament are located within the cavity, the air supply pipe is bent to form a closed frame, the filament is accommodated in the frame, the filament is energized to generate hot electrons, the air supply pipe is disposed of at least one air outlet on one side facing the filament, the air outlet is used for outputting an ion-source gas, the ion-source gas collides the hot electrons to produce a plasma.

10. The ion-implantation apparatus according to claim 9, wherein the number of the air outlet is plural, the sizes of the air outlets are the same, and the distribution density of the air outlets are negatively correlated with the distance between the air outlets and the filament.

11. The ion-implantation apparatus according to claim 10, wherein the air outlets are one-way air holes, when the ion-source gas is inputted to the air supply pipe, the air outlets are opened and the ion-source gas flows outside the air supply pipe through the air outlets, when the gas is stopped to be inputted to the air supply pipe, the air outlets are closed, and inside of the air supply pipe is isolated from the outside of the air supply pipe.

12. The ion-implantation apparatus according to claim 11, wherein the filament and the air supply pipe surrounding around the filament forms a plasma generating group and the number of the plasma generating group is plural.

13. The ion-implantation apparatus according to claim 12, wherein the number of the filament in the plasma generating group is plural, the air supply pipe surrounds the plurality of filaments simultaneously.

14. The ion-implantation apparatus according to claim 13, wherein the air supply pipe further comprises branch pipes communicating with the air supply pipe, the branch pipes are located between adjacent filaments in the plasma generation group, the branch pipes are disposed of the air outlets on one side facing the filament.

15. The ion-implantation apparatus according to claim 12, wherein the number of the filament in the plasma generation group is one and the air supply pipe symmetrically surrounds the filament.

16. The ion-implantation apparatus according to claim 9, wherein the ion-source gas is a boron trifluoride gas or a phosphine gas.

17. An ion-implantation method, comprising:
providing an ion-implantation apparatus, wherein the ion-implantation apparatus comprises an ionization chamber, the ionization chamber comprises a cavity, an air supply pipe and at least one filament, the air supply pipe and the filament are located within the cavity, the air supply pipe surrounds the filament and the air supply pipe is disposed of at least one air outlet on one side facing the filament;

applying current to the filament to make the filament generate hot electrons; and inputting an ion-source gas to the air supply pipe, wherein the ion-source gas is outputted through the air outlet and collides with the hot electrons to generate a plasma for implanting to a substrate.

* * * * *